(12) United States Patent
Dow et al.

(10) Patent No.: US 9,105,696 B1
(45) Date of Patent: Aug. 11, 2015

(54) METHOD OF COATING SURFACE OF SUBSTRATE HOLE WITH LAYER OF REDUCED GRAPHENE OXIDE

(71) Applicant: NATIONAL CHUNG HSING UNIVERSITY, Taichung (TW)

(72) Inventors: Wei-Ping Dow, Taichung (TW); Shih-Cheng Chang, Taichung (TW)

(73) Assignee: NATIONAL CHUNG HSING UNIVERSITY, Taichung (TW)

( * ) Notice: Subject to any disclaimer, the term of this patent is extended or adjusted under 35 U.S.C. 154(b) by 0 days.

(21) Appl. No.: 14/451,377

(22) Filed: Aug. 4, 2014

(30) Foreign Application Priority Data

Mar. 19, 2014 (TW) .............................. 103110371 A

(51) Int. Cl.
  *H01L 21/00* (2006.01)
  *H01L 21/768* (2006.01)
  *H01L 21/02* (2006.01)

(52) U.S. Cl.
  CPC .... *H01L 21/76861* (2013.01); *H01L 21/02057* (2013.01); *H01L 21/7685* (2013.01); *H01L 21/76871* (2013.01); *H01L 21/76879* (2013.01)

(58) Field of Classification Search
  CPC ..................... H01L 21/76861; H01L 21/7685; H01L 21/76871; H01L 21/76879; H01L 21/02057
  See application file for complete search history.

(56) References Cited

FOREIGN PATENT DOCUMENTS

WO    2013096273 A1    6/2013

*Primary Examiner* — Long Pham
(74) *Attorney, Agent, or Firm* — Pai Patent & Trademark Law Firm; Chao-Chang David Pai

(57) ABSTRACT

A method for coating a layer of reduced graphene oxide (rGO) on the surface of substrate holes (especially holes with high aspect ratio) includes a serial wet process steps of hydrophilic treatment of the surface of the substrate, self-assembly of a silane layer, steps of grafting of a polymer layer, grafting of graphene oxide (GO), intercalation of metal ions, and intercalation of metal atom/rGO intercalation. The method further includes the decoration of conductive metals (copper or nickel tungsten) plug on the rGO layer in holes by electroplating process.

15 Claims, 5 Drawing Sheets

METHOD OF COATING SURFACE OF SUBSTRATE HOLE WITH LAYER OF REDUCED GRAPHENE OXIDE

BACKGROUND OF THE INVENTION

1. Technical Field of the Invention

The present invention relates to a method for coating a layer of reduced graphene oxide (rGO) onto the surface of substrate holes, especially the holes with high aspect ratio. In particular, the present invention relates to a wet coating process to produce a reduced graphene oxide layer on the surface of holes with high aspect ratio. The rGO layer may replace the barrier layer and seed layer in traditional semiconductor structure for decorating conductive metal (copper or Ti/TiN or Ta/TaN) in holes by electroplating process.

2. Description of the Prior Art

Based on the pursuit of miniaturization and microminiaturization for all kinds of electronic components, the 3D stack package technology is used to reduce the IC volume, and the vertical Through Silicon Via (TSV) and TSV metallization technology have been used to constitute the signaling pathways of 3D IC. TSV has a structure feature of high aspect ratio, which currently uses copper as metal material for having good conductivity. Chemical vapor deposition (CVD) method is used in most copper deposition technology.

In terms of structure and material properties, copper cannot form a self-protective film in the atmosphere, and is easily subject to oxidation and corrosion. Furthermore, copper has high diffusibility inside the crystalline silicon, which makes copper diffuse through $SiO_2$ (insulating layer) into silicon active region, react with $SiO_2$ and Si to form copper-silicon compounds, thus affecting the quality of the dielectric layer in a silicon wafer. To prevent this problem, a barrier layer is deposited on the wall of the hole in the TSV manufacturing process to isolate copper and silicon elements. Titanium nitride (TiN) and tantalum nitride (TaN) are typically used in traditional barrier layers. Since the resistivity of the barrier layer is still too high for the copper electroplating process, a thin and continuous layer of a seed layer must be deposited after the barrier layer. The functional role of the seed layer is to provide a conductive layer required for copper plating reaction and forming the nucleation layer of copper to ensure that the subsequent electroplated copper will completely fill in.

Even though the barrier layer and the seed layer can solve the problem of copper diffusion into silicon wafer and ensure the fill-in of electroplated copper, the silicon wafer using copper as the TSV conductive material still faces critical tests of mechanical strength, durability and reliability because of the material properties of copper and silicon. The main problem is the large difference in coefficient of thermal expansion of copper and silicon, $17.5\times10^{-6}/°$ C. for copper and $2.5\times10^{-6}/°$ C. for silicon. Therefore, thermo-mechanical stresses will be generated when electroplated copper is used in the TSV deep hole filling process. Particularly, thermo-mechanical stress occurs very quickly in the welding procedure of packaging process, leading to cracks between the internal dielectric layer and the Si substrate. To solve this problem, many studies and experiments have been conducted to find out new materials, such as nickel-tungsten alloy, to replace copper as the TSV conductive material of silicon wafer.

On the other hand, new materials can also be used as a diffusion barrier layer of copper material. It is known that the material properties of graphene make it suitable for using in the technique of semiconductor, touch panel or solar cell. WO 2013/096273 disclosed the use of graphene as a barrier layer for copper diffusion. The publication disclosed a chemical vapor deposition (CVD) method to deposit a layer of graphene on the surface of copper or nickel, and then transfer the formed product onto a desired substrate.

Based on the material properties of graphene and the disclosure of WO 2013/096273, the present invention proposes replacing the barrier layer and seed layer of TSV with a graphene layer. However, in the technique disclosed in WO 2013/096273 and the conventionally known CVD method, the graphene layer can only be deposited on a large substrate surface area, and cannot be deposited into the substrate hole with high aspect ratio. Therefore, it is essential to find out how to coat the graphene layer inside the holes of a substrate (particularly the holes with high aspect ratio).

The replacement of the barrier layer and seed layer of TSV with a graphene layer can efficiently simplify the TSV process and reduce its costs, and further achieve the purpose of producing the copper free conductive plug of TSV by a nickel-tungsten alloy to resolve problems arising from the copper filling. Based on this, the benefits of coating a graphene layer on the holes of high aspect ratio in the substrate are highly anticipated.

SUMMARY OF INVENTION

Accordingly, in one aspect, the present invention provides a method for coating a layer of reduced graphene oxide (rGO) on the surface of substrate holes with high aspect ratio. The method is characterized by replacing the barrier layer and seed layer of traditional substrate with rGO, and the subsequent decoration of conductive metals (copper or nickel tungsten) in the holes by electroplating process.

The method for coating a layer of reduced graphene oxide on the surface of substrate holes with high aspect ratio (holes) comprises steps of:

(1) hydrophilic treatment to provide the surface of the substrate and the holes therein with —OH groups;

(2) self-assembly of a silane layer: contacting the treated substrate from step (1) with a silane solution to form a self-assembly layer of silane on the surface of the substrate and the holes therein;

(3) grafting of a polymer layer: contacting the treated substrate from step (2) with a polymer solution to form a polymer layer on the silane layer;

(4) grafting of graphene oxide (GO): contacting the treated substrate from step (3) with an alkaline GO solution to graft a GO layer on the polymer layer, and alcoholizing the GO surface in an alkaline condition;

(5) intercalation of metal ions: contacting the treated substrate from step (4) with a solution of metal ion (such as, Ag) to intercalate the metal ions into the GO layer, and form a metal ion/GO abrasion; and (6) formation of a metal atom/rGO composite layer: contacting the treated substrate from step (5) with a reductant solution to reduce the metal ion into metal atom, and the GO layer into a reduced graphene oxide (rGO) layer to form a metal atom/rGO composite layer on the substrate surface and the hole surface.

The benefits from the present invention will be discussed below. The present invention has successfully performed the coating of a layer of reduced graphene oxide (rGO) onto the surface of substrate holes, especially the holes with high aspect ratio, by a wet process, which solves the problem of conventional CVD method that can only deposit graphene layer on a large substrate surface area but not into substrate holes.

Furthermore, the rGO layer coated on the sidewall and bottom surface of substrate holes by the wet process of present invention may be decorated with conductive metal (copper or nickel tungsten) plugs by a subsequent electroplating process.

The present invention can effectively overcome the aforementioned disadvantages caused by the uneven thermal expansion between conductive copper and silicon substrate.

With the coating of rGO layer on the surface of holes, as the seed layer and the barrier layer, the deposition steps of the titanium nitride barrier layer and copper seed layer in the conventional TSV process can be omitted.

The present invention can be applied to obtain copper free conductive plug of TSV by using a nickel-tungsten filling process.

The wet process of the invention finally makes the metal atom/rGO composite layer coating on the surface of the substrate and the holes, which enhances the conductivity of the modified substrate.

The wet process of the invention, involving no high temperature, high pressure, or the control of complex chemical formulations, is an easy process to achieve large-scale commercial application.

DETAILED DESCRIPTION OF THE INVENTION

Figure 1:
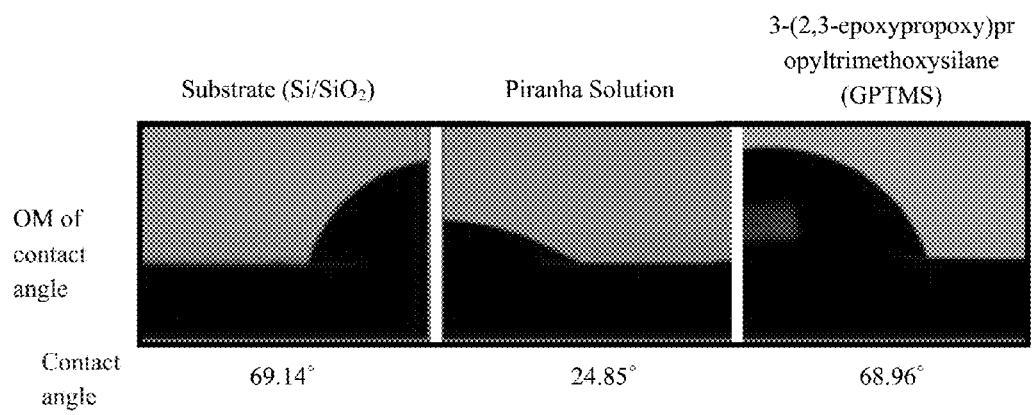
FIG. 1 shows the contact angle of substrate before and after the treatments with piranha solution and GPTMS processing.

The other characteristics and advantages of the present invention will be further illustrated and described in the following examples. The examples described herein are used as illustrations, not as limitations of the invention.

the present invention relates to a method for coating a reduced graphene oxide (rGO) layer on the surface of holes, which comprises following steps:

Step 1: surface hydrophilic treatment to provide the surfaces of a substrate and holes therein having high aspect ratio (referred to as holes hereinafter) with —OH groups This is carried out by immersing a substrate ($Si/SiO_2$, prewashed with ethanol) into a piranha solution for 20 to 40 minutes at 50-90° C., preferably 30 minutes at 70° C. The treated substrate is washed with a washing solution, prepared by mixing a concentrated sulfuric acid solution (95%-98%) and a concentrated hydrogen peroxide solution (~30%) at a ratio of 7:3. By the strong oxidizability of the washing solution, organic remains on the substrate and holes are removed, and the surfaces of the substrate and holes are hydroxylated for presenting excellent hydrophilicity. The treated substrate is immersed in the washing solution and subjected to sonication for 5 seconds. The substrate is removed, rinsed with deionized (DI) water, and dried under nitrogen gas.

Step 2: self-assembly of a silane layer, by contacting the treated substrate from Step 1 with a solution of silane to form a self-assembly silane layer on the surface of the substrate and the holes. The self-assembly is carried out by immersing the treated substrate from Step 1 into a solution of epoxy silane [3-(2,3-epoxypropoxy)propyltrimethoxysilane, GPTMS] at 50-70° C. for 15-25 minutes, preferably at 70° C. for 20 minutes. The epoxy silane solution is prepared by mixing 0.5-1.5V % of epoxy silane and toluene. The treated substrate is subjected to sonication for 5 seconds after immersion, then removed from solution and quickly dried out under nitrogen gas.

Step 3: grafting of a polymer layer, by contacting the treated substrate from Step 2 with a polymer solution to form a polymer layer on the silane self-assembly layer as a support structure for the subsequent graphene oxide (GO) layer. The grafting is carried out by immersing the treated substrate from Step 2 into a 3-10 wt % solution of Polyethyleneimine (PEI) at 40-80° C. for 60-120 minutes, preferably at 60° C. for 90 min. The solvent used for PEI is ethanol. The treated substrate is subjected to sonication for 5 seconds after the immersion step, then removed from solution and dried under nitrogen gas.

Step 4: grafting of a graphene oxide (GO) layer, by contacting the treated substrate from Step 3 with an alkaline GO solution to graft a GO layer on the polymer layer. The grafting is carried out by immersing the treated substrate from Step 3 into a solution of graphene oxide (GO), and NaOH (0.1M, 0.03 ml) is added to keep the solution alkaline (with pH value of 8.5-10, preferably 9.3). The immersion time is 6-12 hours, and the temperature of the solution is 15-35° C., preferably immersing at 25° C. for 12 hours. The treated substrate is subjected to sonication for 5 seconds after the immersion step, then removed from solution, rinsed with DI water, and dried under nitrogen gas. The surface of grafted GO layer is alcoholized in the alkaline condition.

Step 5: intercalation of metal ions, by contacting the treated substrate from Step 4 with a solution of metal ion (Ag) to intercalate the metal ions into the GO layer, and form a metal ion/GO abrasion. The intercalation is carried out by immersing the treated substrate from Step 4 into a 0.05-0.15M (preferably 0.1M) $AgNO_3$ solution at 30-70° C. for 20-40 minutes, preferably at 50° C. for 30 min. The treated substrate is subjected to sonication for 5 seconds after immersion, then removed from solution, rinsed with DI water, and dried under nitrogen gas.

Step 6: formation of a metal atom/rGO composite layer, by contacting the treated substrate from Step 5 with a solution of reductant to reduce the metal ion into a metal atom, and the GO layer into a reduced graphene oxide (rGO) layer to form a metal atom/rGO composite layer on the substrate surface and the hole surface. The formation of a metal atom/rGO composite layer is carried out by immersing the treated substrate from Step 5 into a solution of hydriodic acid (HI solution) at 30-70° C. for 1.5-2.5 hours, preferably at 50° C. for 2 hours. The treated substrate is subjected to sonication for 5 seconds after immersion, then removed from solution, rinsed with DI water, and dried under nitrogen gas. The solution of reductant for this step may be HI solution, sodium borohydride solution, ascorbic acid solution, ethanol solution, or hydrazine solution.

Identification of Grafting:

Measurement of the Contact Angle.

In order to make it easier for the self-assembly of silane molecules on the substrate, the substrate is firstly immersed in a piranha solution to roughen the surface of the substrate and increase the numbers of hydroxyl groups (—OH) on the surface. As showed in FIG. 1, the contact angle of the treated substrate is significantly decreased (from 69.14 degrees to 24.85 degrees), which indicated that the surface becomes more hydrophilic. After the immersion in GPTMS, the contact angle is sharply increased, indicating the adhesion of GPTMS onto the substrate will cause changes in hydrophilicity.

Electron Spectroscopy for Chemical Analysis (ESCA) of Silane Grafting and Polymer Grafting.

Figure 2:
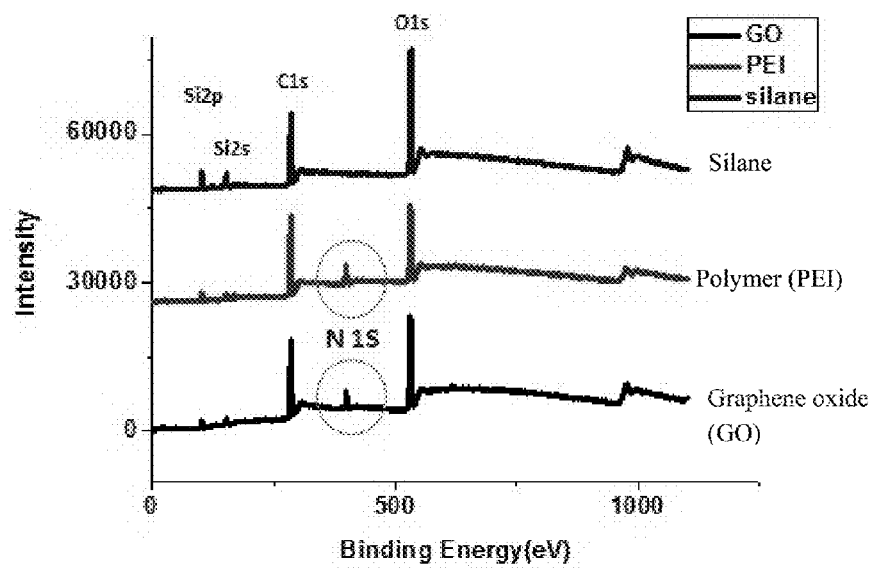
FIG. 2 shows an electron spectroscopy for chemical analysis (ESCA) spectrum of the substrate after grafting of silane and polymer (PEI) layers.

As showed in FIG. 2, only Si and O signals are presented on the substrate. Therefore, a successful grafting of silane is proven by the appearance of C1s signal of Silane in spectrum, and a successful grafting of polymer (PEI) is proven by the appearance of N is signal of PEI (at about 399 eV) in spectrum.

Figure 3:
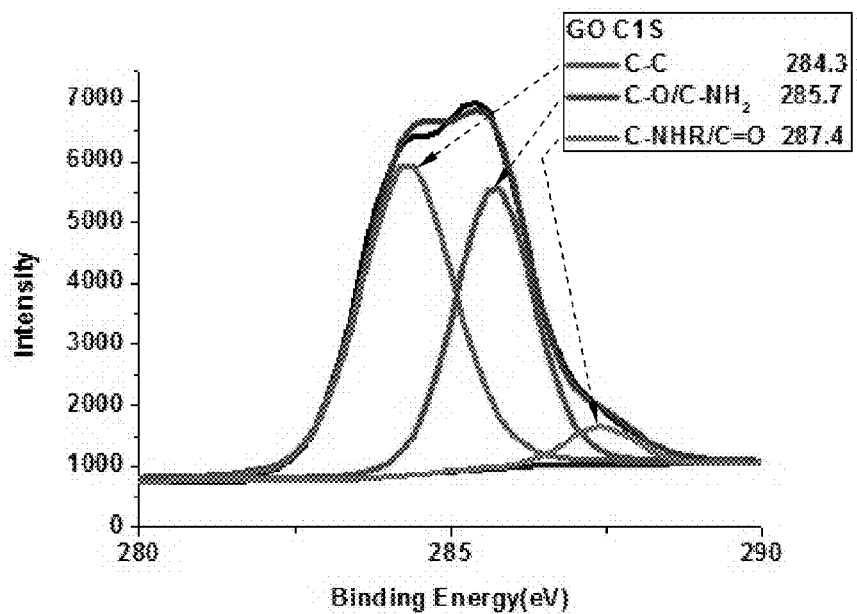
FIG. 3 shows an electron spectroscopy for chemical analysis (ESCA) spectrum of Graphene oxide (GO).
Figure 4:
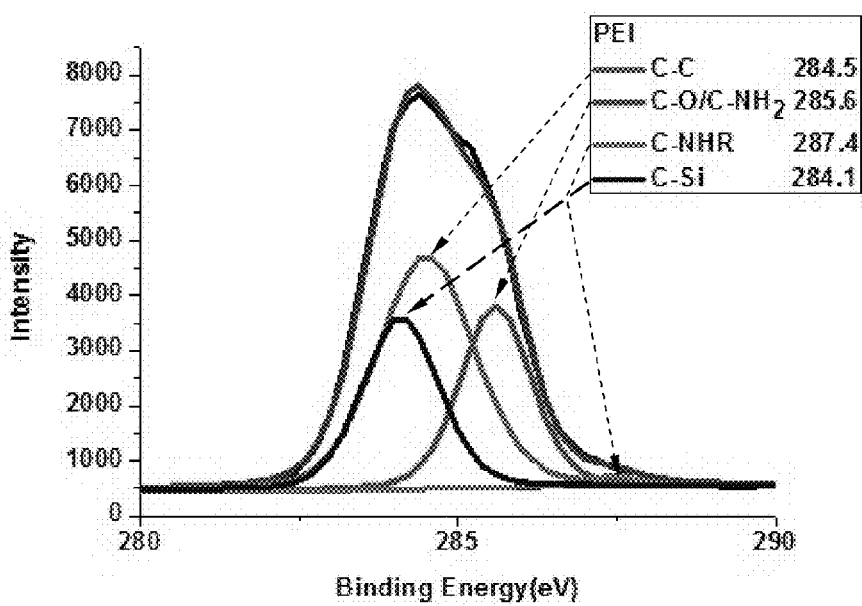
FIG. 4 shows an electron spectroscopy for chemical analysis (ESCA) spectrum of the polymer (PEI) layer.

The electron spectroscopy for chemical analysis (ESCA) of Graphene oxide (GO) is showed in FIG. 3, and the energy spectrum of PEI is showed in FIG. 4. In the graphene oxide (GO) grafting step, product of the bonding of Amine and Epoxy is C-NHR. By comparing FIG. 3 and FIG. 4, more Amine with Epoxy bonding have occurred by the Peak change of C-NHR at 287.4 eV, proving the successful grafting of GO.

Figure 5:
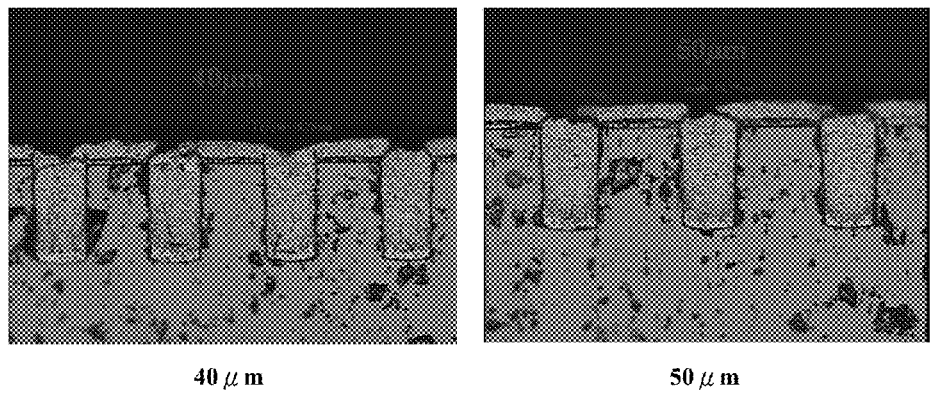
FIG. 5 shows the electron spectroscopy for chemical analysis (ESCA) of surface element.

In ESCA analysis of the surface element, not only ESCA energy spectra but also the S (sulfur) residual signal are capable of proving the grafting of GO, as showed in FIG. 5. Because GO is prepared by a Hummer Method and $H_2SO_4$ is used in the Hummer Method, there is sulfur residual in GO, therefore the successful grafting of GO is proven by the appearance of S signal.

Plated Copper Filling Experiment Proving the Copper Plating Capacity of the Holes in the Substrate Modified with the Metal Atom/rGO Composite Layer.

Figure 6:
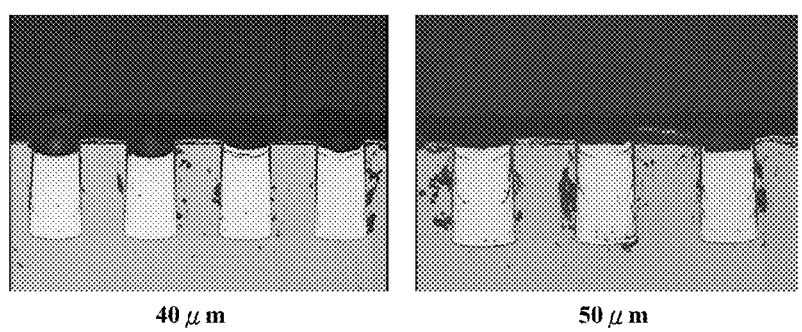
FIG. 6 shows SEM (scanning electron microscope) images of copper filling in the substrate holes with pore size of 40 μm and 50 μm.

The formula of copper plating solution comprises 0.88M of copper sulphate ($CuSO_4$), 3V % of sulfuric acid ($H_2SO_4$), 50 ppm of polyamide (PA), 200 ppm of polyethylene glycol (PEG 8000), 1 ppm of bis(3-sulfopropyl) disulfide (SPS), and 60 ppm of chlorine ion (Cr). Operating condition is listed as follows. Current density: 2.5 ASF, Air flow rate: 2 NL/min, and plating time: 50 min. As showed in FIG. 6, the substrates with pore size of 40 μm and 50 μm both obtain the copper filling with hole bottom up and non-porous superfilling.

Nickel-Tungsten Alloy Filling Experiment Proving the Nickel-Tungsten Depositing Capacity of the Holes in the Substrate Modified with the Metal Atom/rGO Composite Layer.

Figure 7:
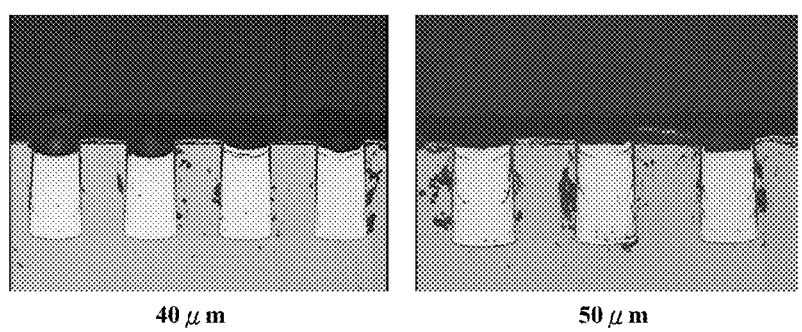
FIG. 7 shows SEM images of Nickel-tungsten alloy filling in the substrate holes with pore size of 40 μm and 50 μm.

The plating solution comprises 0.3M of nickel sulfamate, 0.06M of sodium tungstate, 0.05M of anhydrous citric acid ($C_6H_8O_7$), 0.12M of sodium citrate, sodium hydroxide, sulfuric acid and ammonia water to adjust the PH value to 4.5 to 5.0, ethylene hydrocarbon polymers, anionic surfactant, SPS and chlorine; controlling a cathode current density of a fixed value between 2.5ASF~3.5ASF, plating for 3 to 4 hours. As showed in FIG. 7, the substrates with pore size of 40 μm and 50 μm both obtain the nickel-tungsten filling with hole bottom up and non-porous superfilling.

Figure 8:
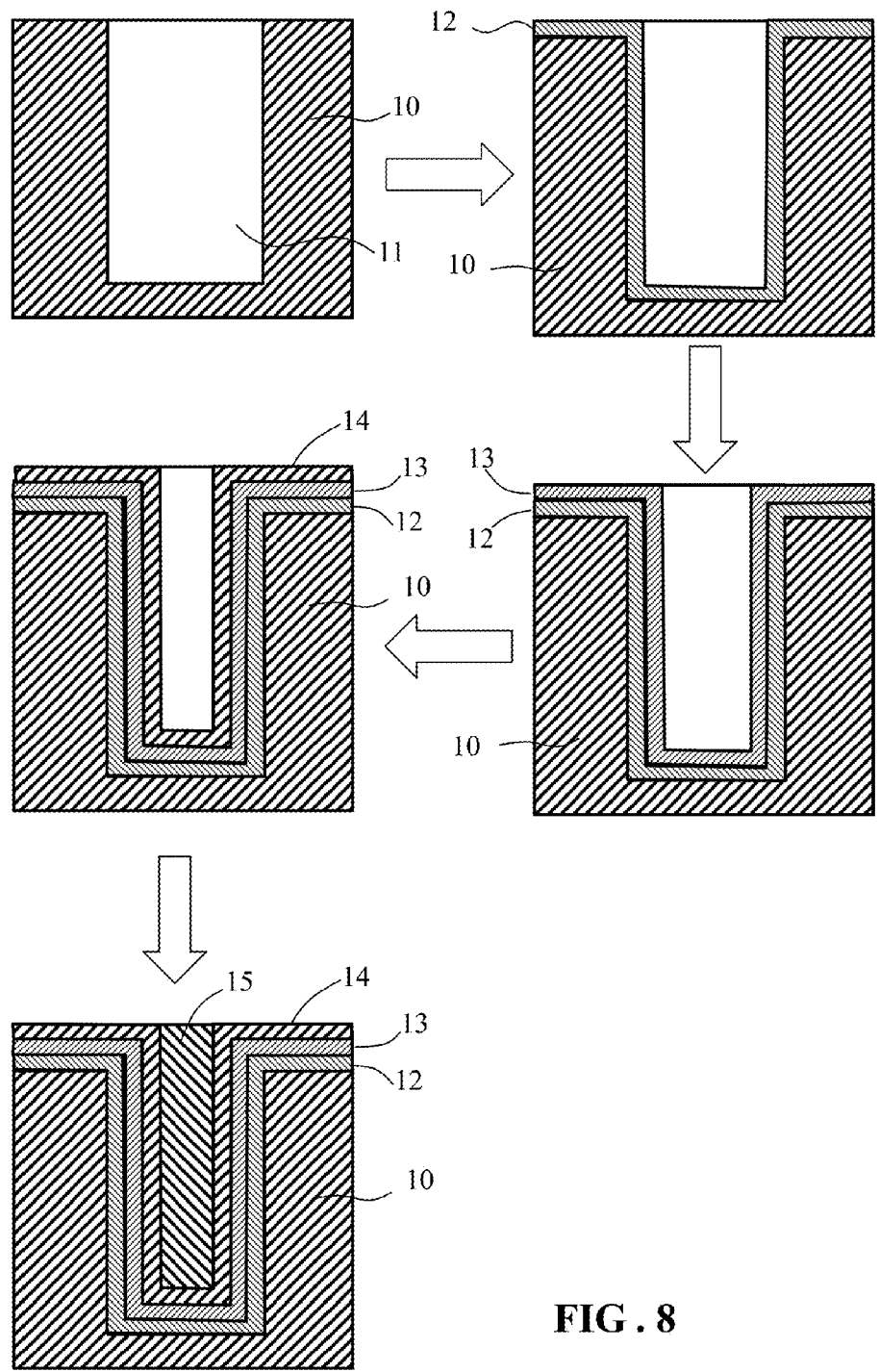
FIG. 8 shows a schematic diagram of traditional copper filling process.

The traditional copper filling process, as showed in FIG. 8, generally includes the following five procedures:
  (1) via etching of the holes 11 in the silicon substrate 10;
  (2) depositing an insulating layer 12 on the wall surface, wherein the material of insulating layer may be silicon dioxide;
  (3) depositing a barrier layer 13 on the surface of the insulating layer 12, wherein the material of barrier layer may be titanium nitride (TiN) or tantalum nitride (TaN);
  (4) depositing a copper seed layer/conductive layer 14 on the surface of the barrier layer 13; and
  (5) filling copper 15 in the hole.

It is known that in the TSV plating copper hole filling technique, a barrier layer is necessary to prevent the diffusion of copper ions into the silicon element, and a copper seed layer is needed for the adhesion and deposition of subsequent copper filling. However, because of the material properties of copper and silicon (e.g. the difference of thermal expansion coefficients is too large), silicon wafers using copper as a TSV conductive material or filling material can be unsatisfactory in their mechanical strength, durability and reliability.

Figure 9:
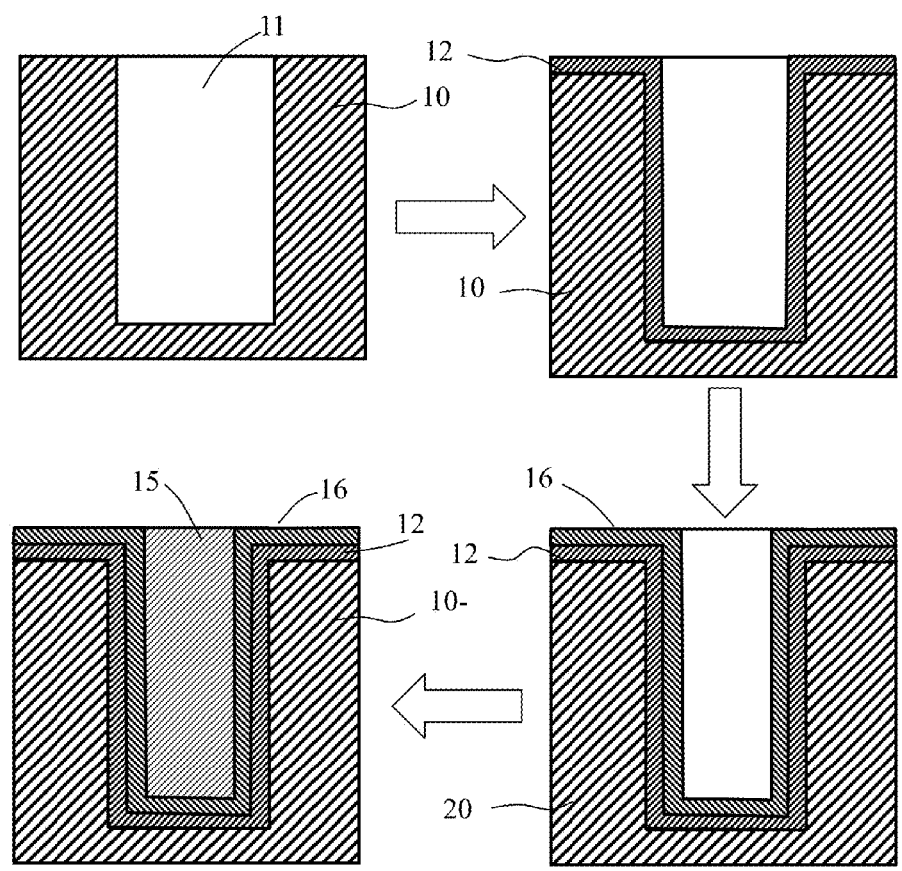
FIG. 9 shows a schematic diagram of the copper filling process according to the present invention.

In the present invention, the metal atom/rGO composite layer is coated on the surface of holes by the wet process, so that the reduced graphene oxide layer is coated on the sidewalls and bottom of the channel, in order to facilitate the subsequent decoration of conductive metals (copper or nickel-tungsten) in the holes. With the present invention, the barrier layer and seed layer can be omitted by using the copper hole filling process. As showed in FIG. 9, the copper hole filling process generally comprises the following four procedures:
  (1) via etching of the holes 11 in the silicon substrate 10;
  (2) depositing an insulating layer 12 on the wall surface, wherein the material of insulating layer may be silicon dioxide;
  (3) forming a metal atom/rGO composite layer 16 on the surface of the insulating layer 12 by the wet process of present invention as described above. Due to the properties of high mechanical strength, high thermal conductivity, low resistance, high conductivity, low coefficient of linear expansion, and high dimensional stability of graphene, the metal atom/rGO composite layer 16 can replace conventional barrier layer and seed layer.
  (4) filling copper 15 in the hole, or filling nickel-tungsten filling in the hole to produce copper free conductive plug of TSV.

The invention claimed is:
1. A method for coating a layer of reduced graphene oxide on the surface of holes in a substrate, comprising:
  Step 1 (surface hydrophilic treatment) washing the substrate with alcohol, immersing the substrate in a mixed solution of concentrated sulfuric acid and concentrated hydrogen peroxide, and removing organic remains on the substrate, to offer the surfaces of the substrate and holes carrying —OH groups;
  Step 2 (self-assembly of a silane layer) immersing the treated substrate from Step 1 in a silane solution to form a self-assembly silane layer on the surface of the substrate and the holes;
  Step 3 (grafting of a polymer layer) immersing the treated substrate from Step 2 in a polymer solution to form a polymer layer on the self-assembly silane layer;
  Step 4 (grafting of a graphene oxide (GO) layer) immersing the treated substrate from Step 3 in an alkaline GO solution to graft a GO layer on the polymer layer;

Step 5 (intercalation of metal ions) immersing the treated substrate from Step 4 in a solution of metal ion to intercalate the metal ions into the GO layer, and form a metal ion/GO abrasion; and Step 6 (formation of a metal atom/rGO composite layer) immersing the treated substrate from Step 5 in a solution of reductant to reduce the metal ion into metal atom, and the GO layer into a reduced graphene oxide (rGO) layer to form a metal atom/rGO composite layer on the substrate surface and the hole surface.

2. The method of claim 1, wherein the immersion time in Step 1 is 20-40 min and the temperature of the solution is 50-90° C.

3. The method of claim 1, wherein the silane solution in Step 2 is a 0.5-1.5V % solution of epoxy silane.

4. The method of claim 3, wherein the silane solution in Step 2 is a solution of 3-(2,3-epoxypropoxy)propyltrimethoxysilane (GPTMS).

5. The method of claim 1, wherein the immersion time in Step 2 is 15-25 min and the temperature of the solution is 50-70° C.

6. The method of claim 1, wherein the polymer solution in Step 3 is a 3-10 wt % solution of Polyethyleneimine (PEI).

7. The method of claim 1, wherein the immersion time in Step 3 is 60-120 min and the temperature of the solution is 40-80° C.

8. The method of claim 1, wherein the pH value of the alkaline GO solution in Step 4 is 8.5-10.

9. The method of claim 1, wherein a 0.1M solution of NaOH is added to the GO solution to form the alkaline GO solution in Step 4.

10. The method of claim 1, wherein the immersion time in Step 4 is 6-12 hours and the temperature of the solution is 15-35° C.

11. The method of claim 1, wherein the solution of metal ion in Step 5 is a 0.05-0.15M $AgNO_3$ solution.

12. The method of claim 1, wherein the immersion time in Step 5 is 20-40 min and the temperature of the solution is 30-70° C.

13. The method of claim 1, wherein the solution of reductant in Step 6 is a solution selected from the group consisting of HI solution, sodium borohydride solution, ascorbic acid solution, ethanol solution, and hydrazine solution.

14. The method of claim 1, wherein the immersion time in Step 6 is 1.5-2.5 hours and the temperature of the solution is 30-70° C.

15. The method of claim 1, wherein a sonication procedure is included in the immersion process of Step 1 to the Step 6.

* * * * *